United States Patent
Christensen et al.

(10) Patent No.: US 9,191,255 B2
(45) Date of Patent: Nov. 17, 2015

(54) METHOD AND APPARATUS FOR COMPENSATING FOR FREQUENCY ERRORS BETWEEN BASE STATION AND MOBILE STATION

(71) Applicant: Spreadtrum Communications USA Inc., San Diego, CA (US)

(72) Inventors: Lon Christensen, San Diego, CA (US); David Haub, San Diego, CA (US)

(73) Assignee: Spreadtrum Communications USA Inc., San Diego, CA (US)

( * ) Notice: Subject to any disclaimer, the term of this patent is extended or adjusted under 35 U.S.C. 154(b) by 175 days.

(21) Appl. No.: 13/826,311

(22) Filed: Mar. 14, 2013

(65) Prior Publication Data

US 2014/0270004 A1    Sep. 18, 2014

(51) Int. Cl.
| | |
|---|---|
| H04L 27/152 | (2006.01) |
| H04B 1/7073 | (2011.01) |
| H03L 7/18 | (2006.01) |
| H03L 7/197 | (2006.01) |
| H03L 7/185 | (2006.01) |
| H03L 7/183 | (2006.01) |

(52) U.S. Cl.
CPC ............... *H04L 27/152* (2013.01); *H03L 7/18* (2013.01); *H03L 7/197* (2013.01); *H03L 7/1974* (2013.01); *H04B 1/7073* (2013.01); *H03L 7/183* (2013.01); *H03L 7/185* (2013.01)

(58) Field of Classification Search
CPC ........... H03L 7/18; H03L 7/185; H03L 7/183; H03L 7/197; H04B 1/7073

USPC .......... 375/219, 327, 344, 354, 355; 327/115, 327/159; 331/2, 10, 11, 176
See application file for complete search history.

(56) References Cited

U.S. PATENT DOCUMENTS

| | | | | |
|---|---|---|---|---|
| 6,008,703 | A * | 12/1999 | Perrott et al. | 332/100 |
| 7,626,462 | B1 * | 12/2009 | Hietala et al. | 331/2 |
| 8,509,208 | B2 * | 8/2013 | Rimini et al. | 370/343 |
| 8,680,933 | B2 * | 3/2014 | Terasawa | 331/176 |
| 2009/0085622 | A1 * | 4/2009 | Shen et al. | 327/159 |
| 2009/0221235 | A1 * | 9/2009 | Ciccarelli et al. | 455/62 |
| 2010/0091921 | A1 * | 4/2010 | Den Besten et al. | 375/354 |
| 2014/0187294 | A1 * | 7/2014 | Bartnik et al. | 455/574 |

* cited by examiner

*Primary Examiner* — Daniel Washburn
*Assistant Examiner* — Eboni Hughes
(74) *Attorney, Agent, or Firm* — Ballard Spahr LLP

(57) ABSTRACT

Methods and apparatuses for compensating for frequency mismatch between a base station and mobile station are disclosed. At a first oscillator, a fixed reference oscillation signal is generated. At a second oscillator, a baseband oscillation signal is generated. A frequency divided version of the baseband oscillation signal is locked to a frequency divided version of the first reference oscillation signal. At a third oscillator, a first RF oscillation signal is generated. A frequency divided version of the first RF oscillation signal is locked to the frequency divided version of the second reference oscillation signal. A frequency adjustment signal is inputted to the second and third oscillators. At the second and third oscillators, frequency errors of the baseband oscillation signal and first RF oscillation signal, respectively, are compensated based on the frequency adjustment signal.

17 Claims, 6 Drawing Sheets

METHOD AND APPARATUS FOR COMPENSATING FOR FREQUENCY ERRORS BETWEEN BASE STATION AND MOBILE STATION

FIELD

The present disclosure relates to wireless communication systems, and more particularly, some embodiments relate to methods and systems for compensating for frequency errors between a base station and a mobile station.

BACKGROUND

Cellular communication systems transmit at radio frequencies (RF) that are typically several orders of magnitude higher than the bandwidth of the cellular signal. Additionally, baseband systems for cellular mobile stations and base stations must use a frequency reference in order to generate a modulated baseband signal. Therefore, radio receivers, transmitters, and basebands are implemented using tuned oscillators. In a typical cellular system, on the downlink, tuned oscillators in the base station are used to create a signal and convert it to RF (using a mixer) in the transmitter. A mobile station receives the RF signal, converts it to baseband, and demodulates it using tuned oscillators. A similar approach is followed on the uplink, using tuned oscillators with the roles of base station and mobile station reversed.

The tuned oscillators at the base station and mobile station will each have a frequency error which can cause issues in the cellular system. First, the frequency error between base station and mobile station can either prevent synchronization between them or cause the synchronization to take a long time. Second, the frequency error can cause the demodulation of the cellular signal to fail. One additional problem associated with the frequency error is that it varies with environmental conditions, in particular temperature. Thus, even if the frequency error is small at one point in time, later when the temperature changes the error may also change, causing synchronization and demodulation issues.

SUMMARY

In some embodiments of the present disclosure, an apparatus includes a reference oscillator and first and second fractional-N phase lock loop (PLL) frequency synthesizers. The reference oscillator is configured to provide a reference oscillation signal. The first PLL frequency synthesizer is configured to receive the reference oscillation signal as an input, output a baseband oscillation signal, and lock a frequency divided version of the baseband oscillation signal to a frequency divided version of the reference oscillation signal. The second PLL frequency synthesizer is configured to receive the reference oscillation signal as an input, output a first radio frequency (RF) oscillation signal, and lock a frequency divided version of the first RF oscillation signal to the frequency divided version of the reference oscillation signal. The first and second PLL frequency synthesizers have respective inputs for receiving a frequency adjustment signal. The first and second PLL frequency synthesizers are each further configured to compensate a frequency error of the corresponding output oscillation signal based on the frequency adjustment signal.

In some embodiments, a method includes generating a fixed reference oscillation signal at a first oscillator. At a second oscillator, a baseband oscillation signal is generated. A frequency divided version of the baseband oscillation signal is locked to a frequency divided version of the first reference oscillation signal. At a third oscillator, a first radio frequency (RF) oscillation signal is generated. A frequency divided version of the first RF oscillation signal is locked to the frequency divided version of the second reference oscillation signal. A frequency adjustment signal is provided as an input to the second and third oscillators. At the second oscillator, a frequency error of the baseband oscillation signal is compensated based on the frequency adjustment signal. At the third oscillator, a frequency error of the first RF oscillation signal is compensated based on the frequency adjustment signal.

In some embodiments, a method includes at a mobile station receiving a pilot signal from a base station. At the mobile station, a local version of the pilot signal is generated. At a physical layer processing module of the mobile station, a frequency error is measured between the received pilot signal and the local version of the pilot signal. A determination is made as to whether the measured frequency error exceeds a predetermined threshold. If the measured frequency error exceeds the predetermined threshold, a new divide term is computed based on the measured frequency error and a divider of a fractional-N phase lock loop (PLL) circuit is set to divide in frequency an output signal of said PLL circuit by the computed new divide term.

In some embodiments, a method includes retrieving, from a memory of the mobile station, a stored temperature of an oscillator of the mobile station. The stored temperature corresponds to a first time. A temperature differential at the oscillator, between the first time and a second time, is computed. A frequency differential for the oscillator is estimated based on the computed temperature differential. An initial divide term is computed based on the computed frequency differential. A fractional-N phase lock loop (PLL) circuit is operated. The PLL circuit has a reference signal as an input. An oscillator signal at an output of the PLL circuit is divided in frequency, at a divider of the PLL circuit, by the computed initial divide term.

In some embodiments, a method includes retrieving, from a memory of the mobile station, a stored time value, wherein the stored time value is a first time value corresponding to a previous wake-up event of the mobile station, and wherein a power-down event occurred between said previous wake-up event and said retrieving. A time differential is computed between the stored time value and a second time value, wherein the second time value is a time of a wake-up event immediately following said previous wake-up event. A frequency differential is estimated for said oscillator based on the computed time differential. An initial divide term is computed based on the computed frequency differential. A fractional-N phase lock loop (PLL) circuit is operated. The PLL circuit has a reference signal as an input. An oscillator signal at an output of the PLL circuit is divided in frequency, at a divider of said PLL circuit, by the computed initial divide term.

BRIEF DESCRIPTION OF THE DRAWINGS

The following will be apparent from elements of the figures, which are provided for illustrative purposes and are not necessarily to scale.

DETAILED DESCRIPTION

This description of the exemplary embodiments is intended to be read in connection with the accompanying drawings, which are to be considered part of the entire written description. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Likewise, terms concerning electrical coupling and the like, such as "coupled," "connected" and "interconnected," refer to a relationship wherein structures communicate with one another either directly or indirectly through intervening structures unless expressly described otherwise.

Various embodiments of the present disclosure provide a cost-effective solution to the above-described frequency offset (mismatch) problem in cellular mobile stations, so that frequency error is reduced to allow accurate reception and transmission. Also, various embodiments compensate for temperature variations in the frequency error at the cellular mobile station.

Figure 1:
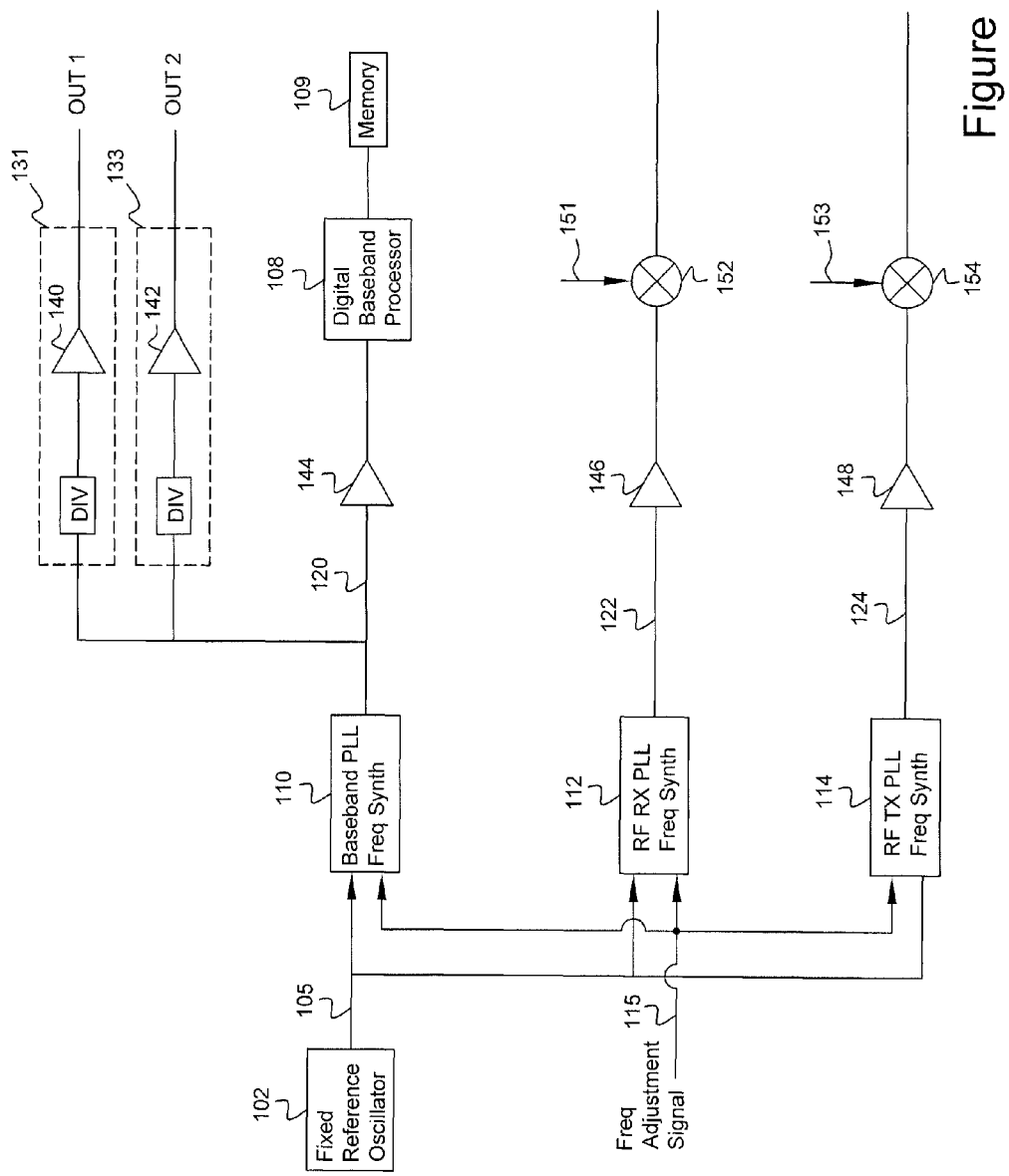
FIG. 1 is a block diagram of an apparatus in accordance with some embodiments of the present disclosure.

FIG. 1 is a block diagram of an apparatus 100 in accordance with some embodiments of the present disclosure. FIG. 1 shows components found at a mobile station (mobile device, e.g., mobile phone) of a cellular communication system. The mobile station is in communication wirelessly with a base station (not shown). An oscillator 102 (e.g., a high frequency, free-running oscillator) provides a fixed reference frequency signal 105. Oscillator 102, which may be referred to as a fixed reference oscillator (FRO), is a low cost, transistor-based oscillator with either an internal or external tank using low cost, passive components. An oscillator 110 generates a signal 120 for baseband processing. A physical layer processing module 108 may provide digital baseband processing for the mobile station, and this module receives a clock input based on signal 120, e.g. after buffering at a buffer 144. An oscillator 112 generates a signal 122 for processing as part of a receiver module of the mobile station. An oscillator 114 generates a signal 124 for processing as part of a transmitter module of the mobile station. Buffers 146 and 148 may be provided as shown in FIG. 1. The receiver and transmitter may include mixers 152 and 154, respectively, for mixing signals 151 and 153 based on signals 122 and 124, respectively.

The baseband oscillator 110, receiver oscillator 112, and transmitter oscillator 114 of the mobile station are each implemented with fractional-N phase lock loops (PLL) frequency synthesizers that derive their respective output signals 120, 122, 124 from the fixed reference signal 105. The fractional-N architecture provides fast lock times and allows the output frequency of the respective PLLs to be adjusted in very small steps, e.g. 10-100 Hz. Unlike prior art techniques, additional circuitry and complexity is not needed in order to implement frequency tuning. A frequency adjustment signal (which may be a multi-bit signal) for reducing the frequency error is applied directly to the PLL circuits 110, 112, 114 that generate the tuned oscillator signals 120, 122, 124. Thus, unlike the prior art, the reference signal is fixed and the error in the tuned oscillator signals is reduced within the PLL circuits. This is possible due to the small frequency adjustment capability of the fractional-N synthesizers.

In some embodiments, external reference signals are derived from the baseband PLL in order to support other systems, e.g. Bluetooth, WiFi, GPS, and the like, as shown by modules 131 and 133 that include dividers 130, 132 and buffers 140, 142 as shown in FIG. 1. For example, 26 MHz buffered reference outputs (labeled as OUT1 and OUT2) may be derived from the baseband PLL as shown. Within each of modules 131 and 133, the corresponding divider divides the baseband reference frequency to the desired output, e.g., 26 MHz as shown. In a typical implementation, the baseband PLL operates at a high frequency (e.g., greater than 100 MHz) that is a multiple of a particular value (e.g., 26 MHz), for example 4*26=104 MHz. For this case, the dividers 130 and 132 are programmed to divide by four (i.e., the divide term for those dividers is 4), so that the reference outputs are at 26 MHz, which is a common frequency used by peripheral circuits (WiFi, Bluetooth, GPS, and the like).

Adjustment of reference tuning to compensate for temperature variation is not necessary during normal operation where the AFC algorithm is used to adjust the frequency. However, in certain cases where the mobile station is turned off at one temperature and then is turned back on at a different temperature, the frequency reference will move and synchronization with the base station will take longer. Circuitry of oscillators 102, 1120, 112, and 114 are formed in a common semiconductor substrate which may be a silicon-based substrate. Since the temperature of this overall integrated circuit is known by conventional techniques, no additional circuits are required to either measure or compensate for any temperature drift in the reference.

Figure 2:
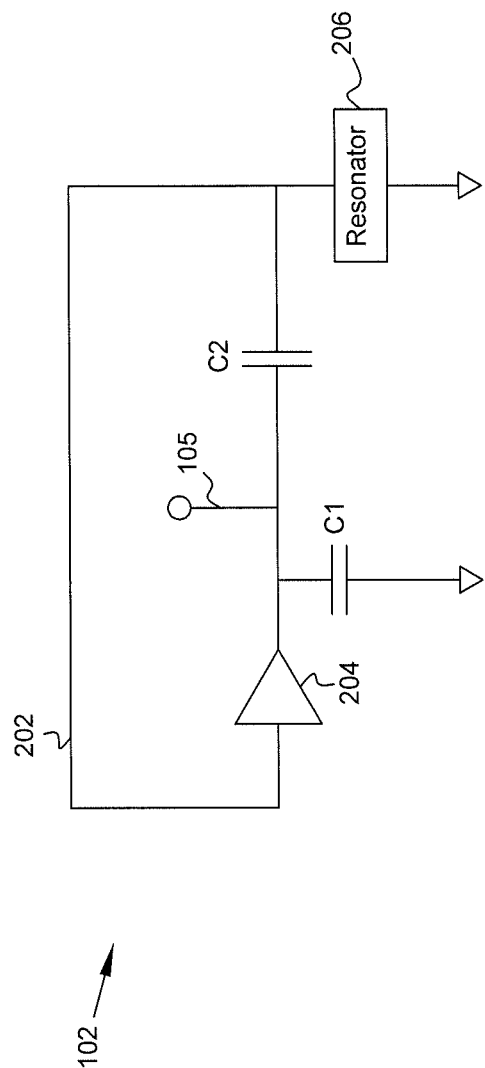
FIG. 2 is a schematic diagram of a fixed reference oscillator circuit in accordance with some embodiments.

FIG. 2 is a schematic diagram of fixed reference oscillator circuit 102 in accordance with some embodiments. This particular block diagram is only one of many possible implementations of oscillator 102. An active device 204 may include a single transistor or multiple transistors in order to provide the gain needed to produce an oscillation. Capacitors C1 and C2 act as a voltage divider to scale the feedback. The feedback path is connected from output to input in order to provide the required condition for oscillation. A resonator 206 may be integrated with the FRO 102 or may be external to the FRO. An integrated resonator 206 can be created using a combination of circuit elements including one or more of resistors, capacitors, inductors, transistors, transmission lines, and the like. These circuit elements can be integrated with the other components of the overall cellular phone design into a single integrated circuit in some embodiments. Example implementations of integrated resonator 206 may include a inductor-capacitor (LC) pair in either a series or parallel configuration to achieve resonance. Resonance is achieved for either configuration when the impedance of the capacitor and inductor are equal. Therefore, the values for inductance and capacitance are chosen to achieve resonance at the desired frequency.

Figure 3:
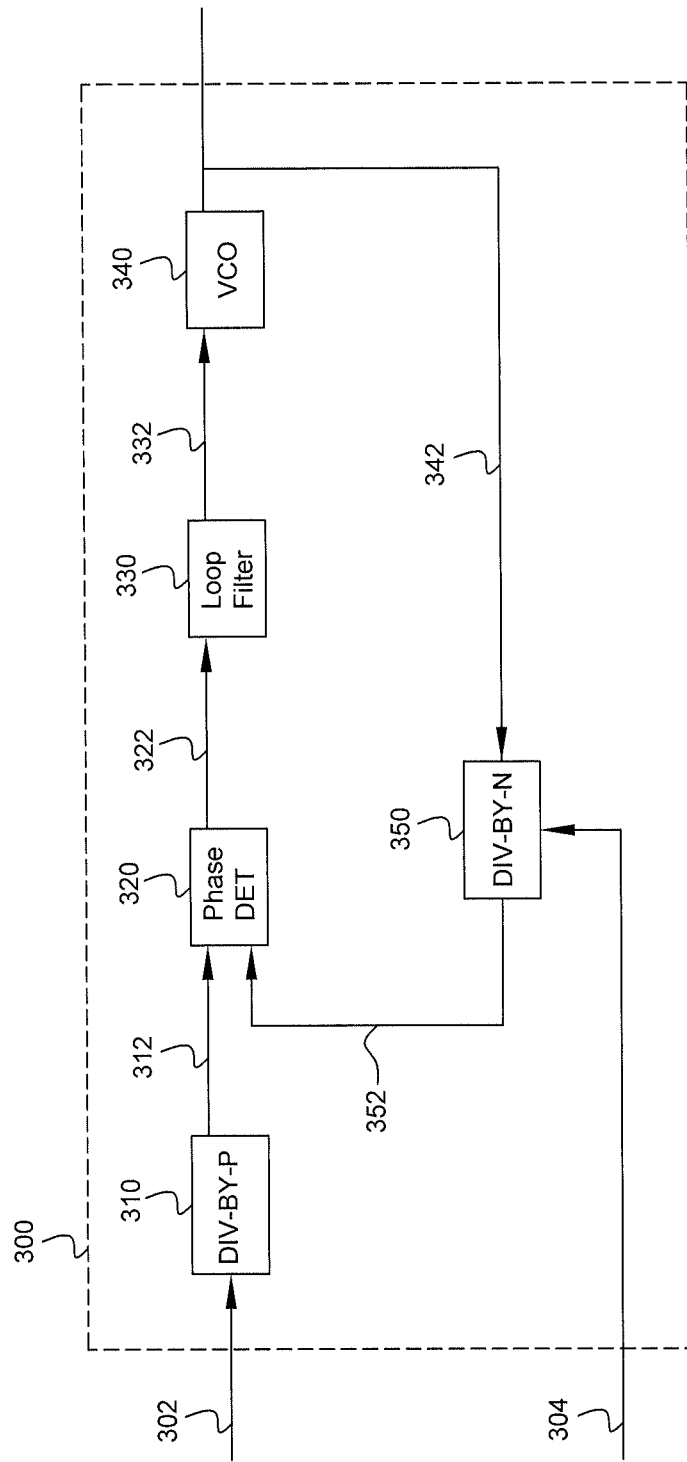
FIG. 3 is a block diagram of a fractional-N phase-lock loop frequency synthesizer in accordance with some embodiments.

FIG. 3 is a block diagram of a fractional-N phase-lock loop (PLL) frequency synthesizer in accordance with some embodiments. The frequency synthesizer architecture shown in FIG. 3 may be used to implement each of synthesizers 110, 112, 114 (FIG. 1). Thus, signals 302 and 304 may be signals 105 and 115, respectively, and signal 342 at the output of synthesizer 300 may be any of signals 120, 122, 124. A reference frequency is provided as reference signal 302. This reference frequency is optionally divided by P (assumed to be an integer) at divider 310 in order to provide the desired phase comparison frequency. The same value of P may be used for dividers 310 at the respective synthesizers 110, 112, and 114. A phase detector 320 measures the phase difference between the signals 312, 352 which is caused by phase or frequency differences between the divided VCO output and divided reference signal. In some embodiments, divider 310 is not needed, e.g., if the phase detector 320 and loop filter 330 are designed to operate at the same frequency as the FRO 102.

A voltage controlled oscillator (VCO) 340 generates the output signal 342 for a desired channel (e.g., a signal at a desired channel frequency). A divider 350 (here shown as divide by N) is used to divide the frequency of the output signal 342 of the VCO by N, to a lower frequency where it can be phase locked to a reference. The divide term (sometimes called divide ratio) N can be either an integer or a fraction, depending on the implementation. Because the divide term N can be a fraction, the output frequency (frequency of signal 342) is adjustable in small steps (fine resolution).

The phase detector output 322 is filtered by a loop filter 330 (e.g., low-pass filter) to provide a smoothed average of the phase difference between the signals 312, 352. This smoothed output is used to adjust the frequency of oscillation of the VCO 340. Consequently, the VCO 340 is adjusted until the phase and frequency of signals 312 and 352 match. Since the divide term N may be fractional, the VCO output signal 342 can be adjusted in frequency steps limited only by the size of the fractional part of the division. The divide ratio N may be modified, as discussed further below, in order to tune the VCO to the correct frequency. Each synthesizer 110, 112, 114 may be operating at a different output frequency and thus may have a different value of N that is updated independently from the other synthesizers.

In some embodiments, synthesizer 300 also includes a charge pump (not shown), e.g., coupled between the phase detector 320 and the loop filter 330. The charge pump, which is optional, converts the voltage output of the phase detector and to current pulses.

Figure 4:
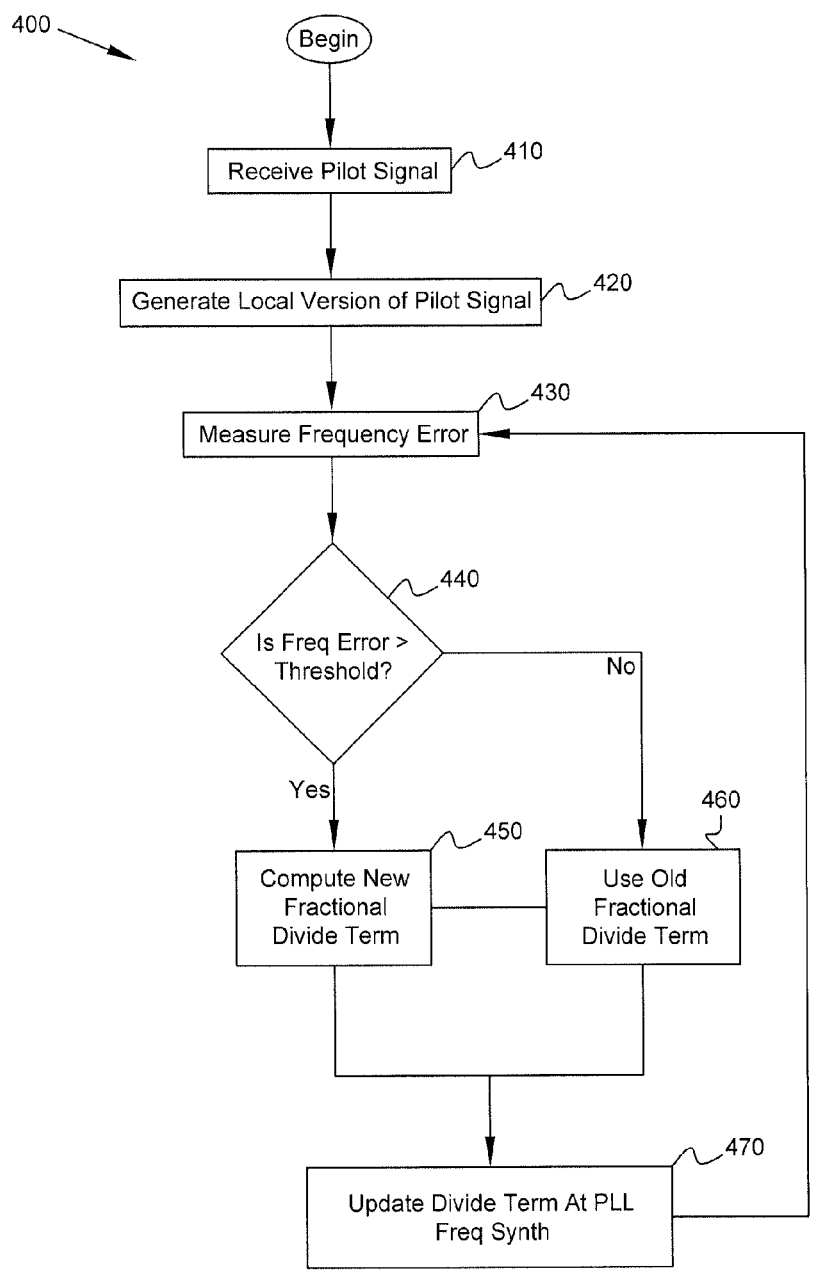
FIG. 4 is a flow diagram of an automatic frequency correction (AFC) process during tracking in accordance with some embodiments.

In some embodiments, the baseband PLL 110 is tuned to match the cellular base station frequency using an automatic frequency correction (AFC) process as discussed below, and thus is more accurate than the fixed reference frequency signal 105. FIG. 4 is a flow diagram of AFC during tracking in accordance with some embodiments. Tracking mode corresponds to when the mobile station and base station are already synchronized to one another and the goal is to keep the frequency error small. That is in contrast to an AFC technique during synchronization, details of which are shown as a flow diagram in FIG. 5.

For track mode AFC (FIG. 4), some embodiments of the present disclosure use adjustment of the divide term N of the respective synthesizers 110, 112, 114 (via the frequency adjustment signal 115 which is inputted to each synthesizer) in order to remove the frequency error. For example, assume that the FRO 102 operates at around 1.664 GHz, which is 26 MHz*64 (i.e., P=64, so that divider 310 divides the frequency of its input signal by 64). Then, the phase detector 320 and loop filter 330 operate at close to 26 MHz, which meets speed and spur requirements for the synthesizer.

Assuming the FRO 102 is operating at 1.664 GHz and the frequency of the channel that is desired to be received is 2.1 GHz (i.e., receive channel frequency=2.1 GHz), then we can estimate that the fractional divide term N (amount divider 350 divides in frequency) as 2.1 GHz/26 MHz=80.7692307692307692307692307692231 . . . . . Because the actual physical implementation is limited in the divide terms that can be achieved, the size of the fractional part of the divider is reduced. The number of decimal places to which the estimated fractional divide term N is rounded is determined by a predetermined limit on step size between frequency errors corresponding to adjacent divide terms (where "adjacent" is meant in the sense of a pair of divide terms that are each written out to the relevant number of decimal places and which only differ in the least significant digit position). For example, to achieve a frequency error step size of no more than 10 Hz between adjacent divide terms, the estimated divide ratio N may be rounded to seven decimal places. The nominal divide term is 80.7692308 and the adjacent divide terms are 80.7692307 and 80.7692309 (thus these three adjacent differ only in their least significant digits which are "7", "8" and "9", respectively). These divide terms yield frequency errors as follows:

Frequency error 1=26 MHz*80.7692307−2.1 GHz=−1.8 Hz

Frequency error 2=26 MHz*80.7692308−2.1 GHz=+0.8 Hz

Frequency error 3=26 MHz*80.7692309−2.1 GHz=+3.4 Hz

A frequency difference of 2.6 Hz is present between each of those adjacent frequency errors, which meets the desired limit of no more than 10 Hz.

In some embodiments, frequency error is measured (block 430) by digital baseband module 108, based on receiving a pilot or reference signal from the base station and comparing that to a version of the pilot that is locally generated at the mobile station, as shown by blocks 410 and 420 of FIG. 4. This comparison may be implemented by a cross-correlation.

In tracking mode, if the starting (initial) divide term is 80.7692308 and the frequency error of +140 Hz is measured, and if the measured frequency error (block 430) exceeds a predetermined threshold (block 440) (e.g., the threshold may be 20 Hz), then the new divide term is calculated as $N_{new}$=round ([2.1 GHz−140 Hz]/[2.1 GHz/$N_{old}$], 7 decimal places)=80.7692254. This computation is understood as follows. The divide term N is the ratio of the channel frequency (i.e., frequency of output of VCO 340) to the frequency at the input of phase detector 320. The numerator in that ratio is computed as the channel frequency minus the error, hence 2.1 GHz−140 Hz, and the denominator in that ratio is computed as the channel frequency divided by the previous (previous in the sense of time) divide term, hence 2.1 GHz/$N_{old}$.

Thus, a new RF frequency of 26 MHz*80.7692254=2.0999998604 GHz is computed, which is −139.6 Hz below 2.1 GHz.

As shown in FIG. 4, the new calculated divide term will be used (i.e., the frequency adjustment signal 304 is set appropriately to update divider 350 to this new calculated divide term, as shown at block 470) and then the process is repeated (i.e., go back to block 430). If the measured frequency error does not exceed the predetermined threshold (block 440), then the old (previous) fractional divide term N can be re-used as shown.

This AFC process will work whether the phase detector frequency is 26 MHz exactly or not (in fact, it is unlikely to be exactly 26 MHz). Since the new divide ratio is calculated based on the old divide ratio and not an assumed phase detector frequency, the actual frequency value is not important. In this way, new divide ratios can be continuously calculated and any drift in the frequency offset can be tracked out.

The AFC process shown in FIG. 4 may be performed for each of PLL synthesizers 110, 112, and 114. In other words, each of these fractional-N synthesizers may have its divide term N computed and updated dynamically as described, in order to reduce frequency error of the output of that synthesizer.

Figure 5:
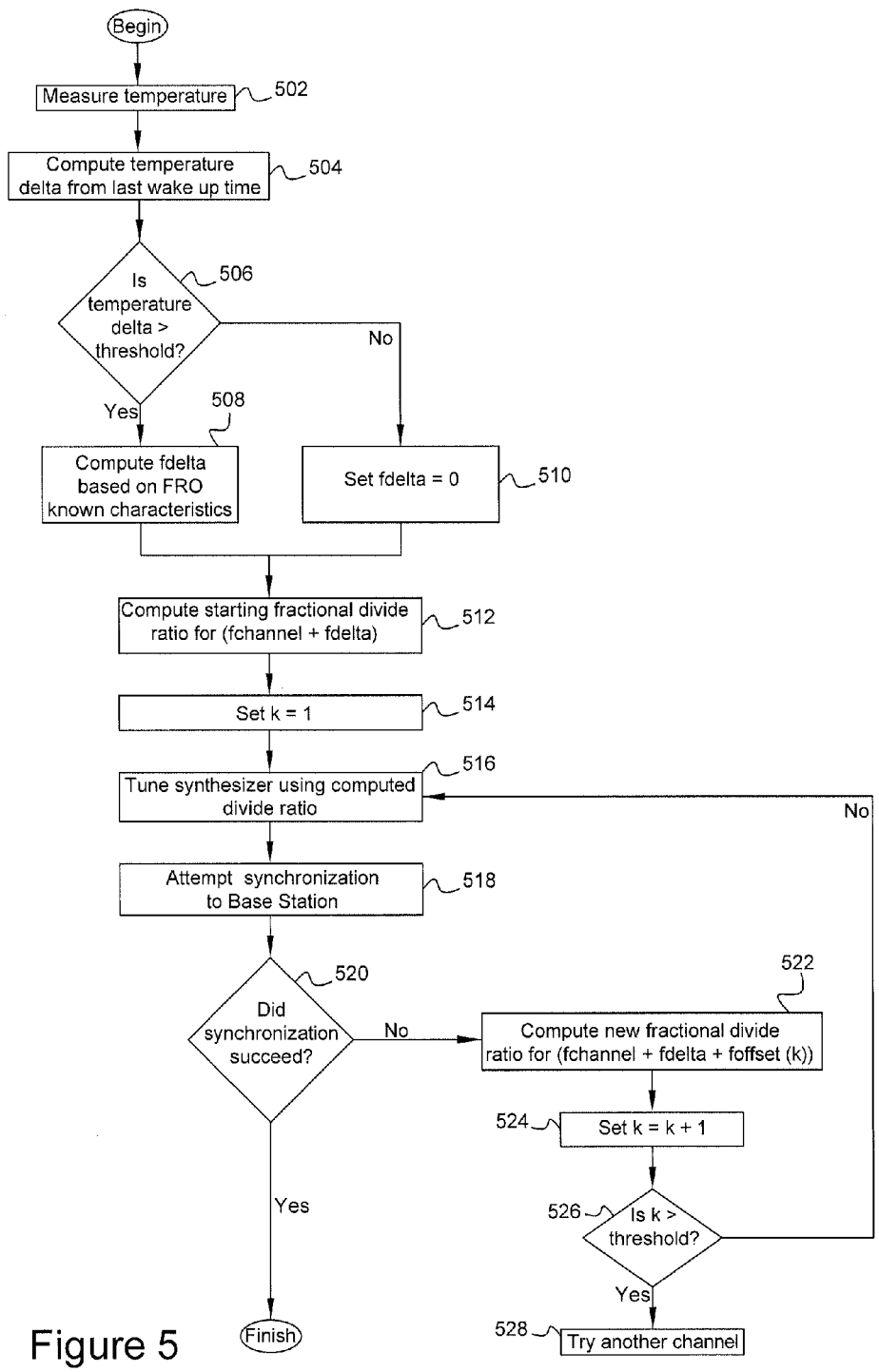
FIG. 5 is a flow diagram of an automatic frequency correction (AFC) process during synchronization between a mobile station and a base station for compensating for temperature variation in accordance with some embodiments.

FIG. 5 is a flow diagram describing AFC operation for initial synchronization. This AFC process may be used to update the divide term N for synthesizers 110 and 112. Synchronization is often performed after the radio of the mobile device has been off for at least a predetermined amount of time and the mobile device is now in a different environment than it was the last time the radio was on. The consideration that is addressed is that the FRO frequency (frequency of signal 105) may have changed significantly since the time when the radio was last on, and this frequency variation (drift) is compensate for in some embodiments. The critical environmental factor that will effect a change in the FRO frequency is temperature. The temperature of oscillators 102, 110, 112, and 114 is measured (block 502) and may be stored in memory 109 for use in future computations, e.g., when the mobile device is next turned on after a power-down event. These oscillators are all formed in a common semiconductor substrate and thus have the same temperature. For example, consider that the FRO 102 operates at a target frequency of 1.664 GHz and that the divide term P for divider 310 is set to 64 as in the previous example. Suppose the frequency variation of the FRO 102 (e.g., due to temperature variation) is about ±100 parts per million (ppm). That means that over the operational temperature range of −40° C. to +100° C., the frequency could vary from 1.6638336000 GHz (1.664 GHz+ 1.664 GHz*−100e-6) to 1.6641664000 GHz (1.664 GHz+ 1.664 GHz*100e-6), which is a frequency shift of ±166.400 kHz. In order to deal with this frequency shift due to temperature, the FRO 102 is characterized versus temperature for a particular radio. For example, temperature-frequency characteristics may be measured on multiple integrated circuits including process corners (parts corresponding to specified variation in parameters, which may correspond to a worst-case scenario), with the results averaged or smoothed and fitted (e.g., to a curve) to yield a typical FRO frequency versus temperature curve. The identified frequency variation versus temperature is stored in a memory 109 of the mobile device as either a lookup table or as an equation (e.g., linear equation, quadratic equation, cubic equation, or any polynomial). For example, assume that the nominal frequency of the FRO is achieved at 30° C. and varies linearly. Thus a linear equation can be written that represents the change in frequency versus temperature as shown:

FRO frequency change slope=[(166.4 kHz−166.4 kHz)/(100° C.−40° C.)]=2377.1429 Hz/° C.

FRO frequency change offset=166.4 kHz− slope*100=−71314 Hz (i.e., this is the frequency at 0° C.).

FRO frequency change estimate=(temperature in ° C.)*2377.1429−71314 Hz (i.e., frequency as a linear function of temperature).

If the cellular system requires a frequency offset error in the FRO of less than 10 kHz (as one example; any predetermined threshold can be used) in order to perform initial synchronization, then a temperature shift of more the [10 kHz/ (2377.1429 Hz/° C.)]=4.2° C. will cause a frequency shift which is beyond that threshold. Therefore, a delta temperature threshold (threshold for temperature differential) may be set to ±4.2° C. To continue this example, suppose a temperature measurement (block 504) reveals that the temperature shifted from +30° C. to +40° C. since the last (previous) wakeup (i.e., a power-off event occurred between the previous measurement of +30° C. and the present measurement of +40° C.). Since the temperature shift (differential) is determined to be greater (in magnitude) than the predetermined threshold (in this case, 4.2° C.) (block 506), the FRO frequency is computed based on known characteristics (the parameters stored in the memory 109, in this case the parameters regarding slope and intercept for the linear equation relating frequency as a function of temperature) as:

FRO frequency shift estimate=[40*2377.1429−71314 Hz]−[30*2377.1429−71314 Hz]=23771 Hz=fdelta Next, the starting divide ratio is computed (block 512) based on the estimated frequency shift. The stored information for the last (previous in time, when temperature was +30° C.) channel and divide ratio N are retrieved from memory in order to compute the target for a new channel at the new temperature. Specifically, the starting divide ratio may be computed as:

$N_{new}$=round($fchannel_{new}/[fchannel_{old}/N_{old}+fdelta/P]$,7 decimal places)

The motivation for the above equation is understood as follows. The divide ratio N is the ratio between the channel frequency and the divided reference frequency. In this case, the numerator of that ratio is the new channel frequency (i.e., $fchannel_{new}$) and the denominator can be expressed as the sum of the old divided reference frequency (which can be written as $fchannel_{old}/N_{old}$ because the two inputs to phase detector 320 have the same frequency due to lock) and a term fdelta/P accounting for the divided frequency shift.

As a specific example, assume that the last channel used was 2 GHz and the divide ratio N was 76.9230769. If the new channel is 2.1 GHz, then the starting divide term may be computed as:

$N_{new}$=round(2.1 GHz/[2 GHz/76.9230769+23771 Hz/64],7 decimal places)=80.7680769

The synthesizer (any of synthesizers 110, 112, 114) is tuned (block 516) using this computed divide term, i.e., the synthesizer is operated with this value of N (i.e., 80.7680769) until phase lock is achieved. An attempt to synchronize the mobile station to the base station is initiated (block 518). If the synchronization attempt succeeds, then the process ends; otherwise, a new fractional divide term is computed using a frequency offset as described below. In general, a search may be performed using the starting divide term as a starting point. The search corresponds to trying various frequency offsets iteratively (one after the other) until a terminating condition is achieved (such as successful synchronization or end of iteration range). Consider a typical range and step size over which to search in order to account for differences in base station frequency and errors in estimation. If, as indicated above, a FRO frequency error of less than 10 kHz is needed for synchronization, then for this example a frequency offset step of 5 kHz may be used for the search. A frequency offset step that is too coarse may result in failed operation for the following reasoning. Suppose a 25 kHz step were used, and suppose the frequency error (due to FRO frequency that shifted) is 38 kHz. If tested with offset steps of 0 kHz, −25 kHz, +25 kHz, −50 kHz, +50 kHz, the actual error would be 38 kHz, 13 kHz, 63 Khz, −12 kHz, 88 kHz, etc., and would never be less than the 10 kHz needed for successful synchronization. The number of offset frequencies to search may be determined based on the worst case estimate of possible total error in the estimation of frequency. For example, assume that a ±100 kHz window is sufficient. In this case, the maximum value of k=[(100 kHz−(−100 kHz))/5 kHz]+1=41. Here, k is an index for indexing the offset frequencies, and the search will iterate over each of these indices k, starting with k=1 (block 514).

The variable foffset is generated based on the range to search and is a function of k (is indexed by k). For the above example assuming linear spacing, foffset=−100 kHz, −95 kHz, −90 kHz, . . . 90 kHz, 95 kHz, 100 kHz for the various values of k from 2 to 41 in some order (e.g., where the starting value k=1 corresponds to foffset=0). Given the foregoing example, the following formula may be used to compute the successive values of the divide ratio (for respective iterations k):

$$N_{new} = \text{round}(fchannel_{new}/[fchannel_{old}/N_{old}+fdelta/P+foffset_k/P], 7 \text{ decimal places})$$

This equation is similar to the above equation for computing the starting divide term but includes an additional term $foffset_k/P$ which corresponds to the current iteration of the search.

So for k=2, the new divide term is:

$$N_{new} = \text{round}(2.1 \text{ GHz}/[2 \text{ GHz}/76.9230769+23771 \text{ Hz}/64+(−100 \text{ kHz})/64], 7 \text{ decimal places})$$

As shown in FIG. 5, for each value of k synchronization is attempted, until the threshold (41 in the above example) is exceeded or synchronization is successful. While the foffset values were selected from minimum to maximum in the foregoing example, other arrangements may be used. For example, the following arrangement may be used: foffset=−5 kHz (for k=2), +5 kHz (for k=3), −10 kHz (for k=4), +10 kHz (for k=5), −15 kHz (for k=6), +15 kHz (for k=7), −95 kHz, +95 kHz, −100 kHz, +100 kHz. This arrangement (involving first searching frequency offsets close to the starting estimate, and moving outwards) is more efficient, assuming the initial estimate of N is not very inaccurate.

Thus, various embodiments remove or reduce frequency error without requiring additional complicated tuning circuits. The technical problem of reducing the frequency error is solved without the use of a crystal oscillator (an expensive component) which has been used in prior approaches. Additionally, the temperature measurement, compensation and frequency tuning of the FRO 102 do not require additional circuits, as the temperature of the FRO 102 is the same as the temperature of the PLLs 110, 112, 114.

Figure 6:
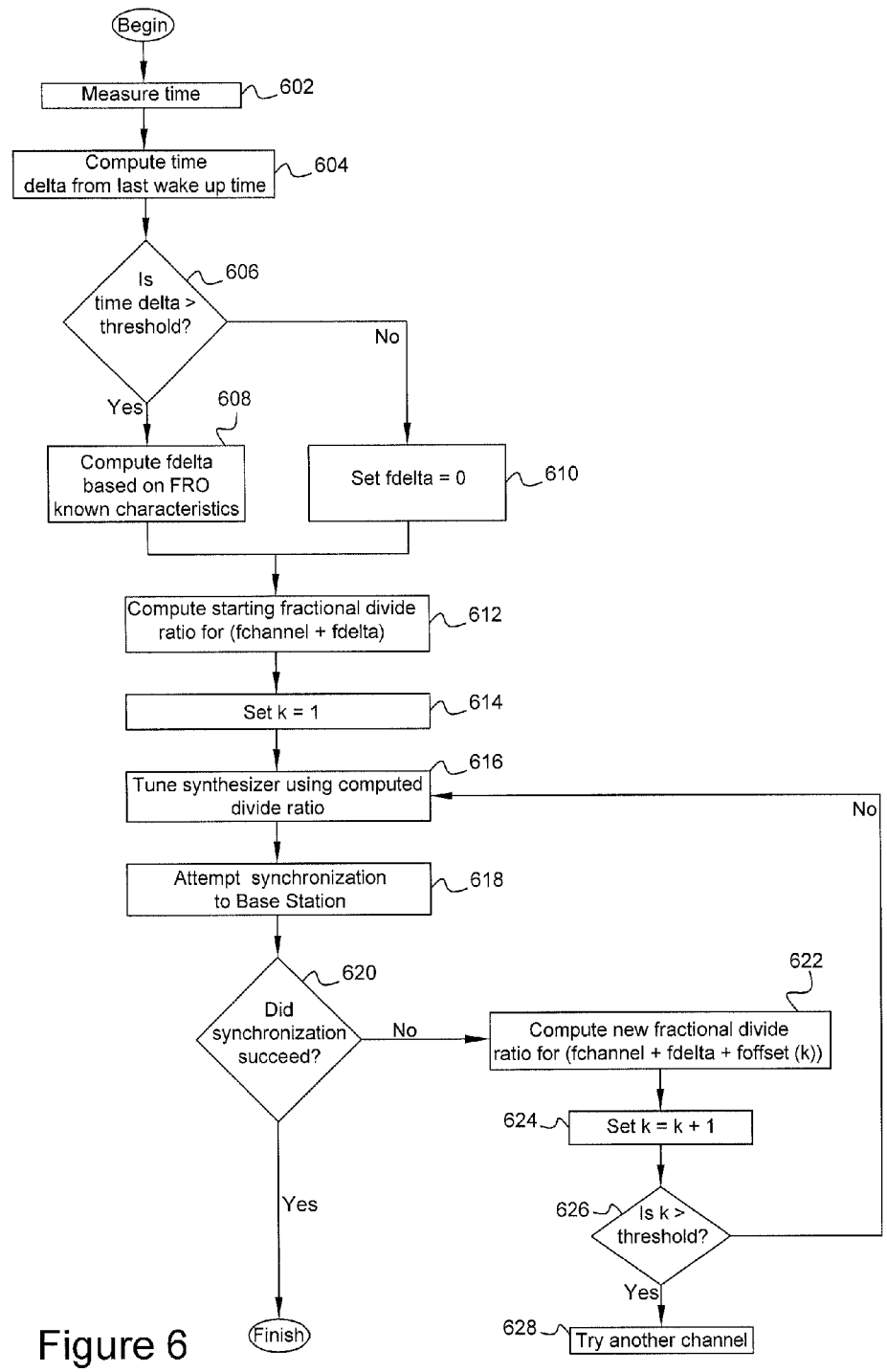
FIG. 6 is a flow diagram of an automatic frequency correction (AFC) process during synchronization between a mobile station and a base station for compensating for aging in accordance with some embodiments.

FIG. 6 is a flow diagram of an automatic frequency correction (AFC) process during synchronization between the mobile station 100 and a base station for compensating for aging in accordance with some embodiments. When the mobile station has been off for a very long time, aging of the fixed reference oscillator (FRO) 102 becomes a significant factor. Aging is drift in the frequency of a reference signal that takes place over time due to physical changes in the integrated circuit. As with temperature variation, the aging characteristic of the FRO 102 can be determined by either experiment, simulation, or some combination thereof. In some embodiments, as shown in FIG. 6, a similar overall approach is employed for compensating for aging as is employed for compensating for temperature variation, except that a time difference, rather than a temperature difference, is measured and used to compute a frequency shift estimate fdelta.

Referring to FIG. 6, the time is measured (block 602), e.g., by checking the time of the real time clock device that is standard on all mobile handsets. Next, a time difference tdelta is computed (block 604) by subtracting the currently measured time from the last (previous) time the mobile device was powered on. For the computation of the time differential, the previous power-on time may be obtained from memory 109. If tdelta exceeds a predetermined threshold (block 606), e.g., 3 months, then an estimated frequency shift fdelta is computed (block 608), which is an estimate of the frequency drift due to aging. A linearity assumption for the relationship between time and frequency drift may be used. As an example, assume the aging of the FRO frequency is 100 ppm per year, which represents a frequency shift of 1.664 GHz*100e-6=16.664 kHz per year. The sign of this shift may be determined or known a priori. Thus, after three months (which is a relatively long time that implicates aging effects), the frequency shift fdelta is computed as (3 months/12 months)*16.664 kHz=4.166 kHz.

Based on this estimated frequency shift fdelta, a starting fractional divide term is computed (block 612), and after initialization of the index k to 1 (block 614), the synthesizer (synthesizer 110 or 112) is tuned using the computed divide term (block 616). An iterative search may be performed with respective frequency offsets until synchronization is successful, as shown in the remainder of FIG. 6. It is noted that FIG. 6 is similar to FIG. 5 from block 608 onwards (with similar blocks in FIG. 6 having the prefix "6" in the reference numeral instead of the prefix "5"). Thus, after an initial phase of the process (blocks 602, 604, 606, 608) in which fdelta is computed based on a time differential instead of a temperature differential, the estimated frequency frequency drift fdelta is used in the same way for the automatic frequency control (AFC) processes of FIG. 5 and FIG. 6 that compensate for temperature variation and aging effects, respectively.

Although examples are illustrated and described herein, embodiments are nevertheless not limited to the details shown, since various modifications and structural changes may be made therein by those of ordinary skill within the scope and range of equivalents of the claims.

What is claimed is:

1. A method comprising:
   at a mobile station, receiving a pilot signal from a base station;
   at the mobile station, generating a local version of the pilot signal;
   at a physical layer processing module of the mobile station, measuring a frequency error between the received pilot signal and the local version of the pilot signal;
   determining whether the measured frequency error exceeds a predetermined threshold;
   if the measured frequency error exceeds the predetermined threshold, computing a new divide term based on the measured frequency error and setting a divider of a fractional-N phase lock loop (PLL) circuit to divide in frequency an output signal of said PLL circuit by the computed new divide term, wherein the new divide term is computed based on an expression (fchannel−err)/(fchannel/$N_{old}$), wherein fchannel is a target channel frequency, err is the measured frequency error, and $N_{old}$ is a previous value of the divide term retrieved from a memory of the mobile station.

2. The method of claim 1, wherein the physical layer processing module is a digital baseband processing module.

3. A method comprising:
   retrieving, from a memory of a mobile station, a stored temperature of an oscillator of the mobile station, the stored temperature being a temperature corresponding to a first time;

computing a temperature differential at the oscillator between the first time and a second time;

estimating a frequency differential for said oscillator based on the computed temperature differential;

computing an initial divide term based on the estimated frequency differential; and operating a fractional-N phase lock loop (PLL) circuit having a reference signal as an input, wherein an oscillator signal at an output of the PLL circuit is divided in frequency, at a divider of said PLL circuit, by the computed initial divide term;

wherein the initial divide term is computed as a ratio of a target channel frequency to an estimate of a frequency of the reference signal at the second time; and computing the estimate of the reference frequency at the second time based on an expression $fchannel_{new}/(fchannel_{old}/Ndiv_{old}+\Delta f/P)$, wherein $fchannel_{new}$ is the target channel frequency, $fchannel_{old}$ is the frequency of the oscillator signal at the first time, $Ndiv_{old}$ is a value of the initial divide term previously computed and corresponding to the first time, $\Delta f$ is the estimated frequency differential, and the frequency of the reference signal is divided by P at the PLL circuit.

4. The method of claim 3, wherein a power-down event for said oscillator occurred between the first and second times.

5. The method of claim 3, wherein the computation of the initial divide term is further based on a frequency of the oscillator signal at the first time.

6. The method of claim 3, wherein the computed initial divide term is $N_0$ and the PLL circuit is operated with the divider set to divide the oscillator signal by $N_0$ until lock is achieved by the PLL circuit, the method further comprising:
initiating an attempt to synchronize the mobile station to a base station.

7. The method of claim 6, further comprising:
computing a new divide term $N_1$ based on the estimated frequency differential and a frequency offset; and
operating the PLL circuit with the divider set to divide the oscillator signal by $N_1$, until lock is achieved by the PLL circuit.

8. The method of claim 6, further comprising:
for each iteration I in a plurality of iterations:
computing a respective divide term $N_I$ corresponding to said iteration, based on the estimated frequency differential and a frequency offset corresponding to said iteration;
operating the PLL circuit with the divider set to divide the oscillator signal by $N_I$, until lock is achieved by the PLL circuit; and
initiating a respective attempt to synchronize the mobile station to the base station.

9. The method of claim 3, wherein the estimated frequency differential is computed based on accessing a table of temperature-frequency pairs stored in the memory.

10. The method of claim 3, wherein the estimated frequency differential is computed based on linear interpolation relative to a linear mapping between frequency and temperature, the method further comprising retrieving parameters of said linear mapping previously stored in the memory.

11. A method comprising:
retrieving, from a memory of a mobile station, a stored time value, wherein the stored time value is a first time value corresponding to a previous wake-up event of the mobile station, wherein a power-down event occurred between said previous wake-up event and said retrieving;

computing a time differential between the stored time value and a second time value, wherein the second time value is a time of a wake-up event immediately following said previous wake-up event;

estimating a frequency differential for said oscillator based on the computed time differential;

computing an initial divide term based on the estimated frequency differential; and operating a fractional-N phase lock loop (PLL) circuit having a reference signal as an input, wherein an oscillator signal at an output of the PLL circuit is divided in frequency, at a divider of said PLL circuit, by the computed initial divide term;

wherein the initial divide term is computed as a ratio of a target channel frequency to an estimate of a frequency of the reference signal at the second time value; and computing the estimate of the reference frequency at the second time based on an expression $fchannel_{new}/(fchannel_{old}/Ndiv_{old}+\Delta f/P)$, wherein $fchannel_{new}$ is the target channel frequency, $fchannel_{old}$ is the frequency of the oscillator signal at the first time value, $Ndiv_{old}$ is a value of the initial divide term previously computed and corresponding to the first time value, $\Delta f$ is the estimated frequency differential, and the frequency of the reference signal is divided by P at the PLL circuit.

12. The method of claim 11, wherein the computation of the initial divide term is further based on a frequency of the oscillator signal at the first time value.

13. The method of claim 11, wherein the computed initial divide term is $N_0$ and the PLL circuit is operated with the divider set to divide the oscillator signal by $N_0$ until lock is achieved by the PLL circuit, the method further comprising:
initiating an attempt to synchronize the mobile station to a base station.

14. The method of claim 13, further comprising:
computing a new divide term $N_1$ based on the estimated frequency differential and a frequency offset; and
operating the PLL circuit with the divider set to divide the oscillator signal by $N_1$, until lock is achieved by the PLL circuit.

15. The method of claim 13, further comprising:
for each iteration I in a plurality of iterations:
computing a respective divide term $N_I$ corresponding to said iteration, based on the estimated frequency differential and a frequency offset corresponding to said iteration;
operating the PLL circuit with the divider set to divide the oscillator signal by $N_I$, until lock is achieved by the PLL circuit; and
initiating a respective attempt to synchronize the mobile station to the base station.

16. The method of claim 11, wherein the estimated frequency differential is computed based on accessing a table of time-frequency pairs stored in the memory.

17. The method of claim 11, wherein the estimated frequency differential is computed based on linear interpolation relative to a linear mapping between frequency and time.

* * * * *